United States Patent [19]

Manabe

[11] Patent Number: 4,580,159
[45] Date of Patent: Apr. 1, 1986

[54] COLOR SOLID-STATE IMAGER WITH COLOR FILTER ARRAY FORMED BY LAYERS OF HYDROPHILIC AND HYDROPHOBIC DYE RECEIVING RESINS

[75] Inventor: Daisuke Manabe, Tokyo, Japan
[73] Assignee: NEC Corporation, Tokyo, Japan
[21] Appl. No.: 542,814
[22] Filed: Oct. 17, 1983

[30] Foreign Application Priority Data

Oct. 15, 1982 [JP] Japan ............................... 57-181122
Jan. 31, 1983 [JP] Japan ................................ 58-14209

[51] Int. Cl.⁴ ...................... H04N 9/077; H04N 9/07;
G02B 5/20; B05D 5/06
[52] U.S. Cl. ...................................... 358/44; 358/43;
350/311; 350/317; 427/162; 427/164;
427/407.1
[58] Field of Search ...................... 358/41, 43, 44, 47,
358/55, 50, 52; 427/162, 164, 165, 168, 169,
407.1, 407.2, 414; 428/212; 350/311, 316, 317;
313/371

[56] References Cited

U.S. PATENT DOCUMENTS 3,981,568 9/1976 Bartolomei .......................... 350/317
4,029,394 6/1977 Araki .................... 350/317
4,370,025 1/1983 Sato et al. ............................ 350/317

FOREIGN PATENT DOCUMENTS 38722 3/1979 Japan ................................... 313/371

Primary Examiner—James J. Groody
Assistant Examiner—Randall S. Svihla
Attorney, Agent, or Firm—Sughrue, Mion, Zinn, Macpeak, and Seas

[57] ABSTRACT

A first layer of first dye receiving resin is deposited to a even thickness on a substrate or on an imaging area of a solid-state imager. A first color region is patterned on the surface of the first layer and dyed in a first color. A second layer is patterned on the first layer and the dyeing property of the second layer differs from that of the first dye receiving layer. A second color region, overlapping with the first color region over at least one pixel, is formed by the second layer, or the first and second color regions are formed in the first layer and a third color region is formed by the second layer between the first and second color regions in the first layer. The first dye receiving resin is hydrophobic and the second is hydrophilic when the filter is formed on the surface of a solid-state imager, and vice versa when the filter is formed on a substrate. A light intercepting layer intervenes between the first and second layers.

12 Claims, 8 Drawing Figures

COLOR SOLID-STATE IMAGER WITH COLOR FILTER ARRAY FORMED BY LAYERS OF HYDROPHILIC AND HYDROPHOBIC DYE RECEIVING RESINS

BACKGROUND OF THE INVENTION

The present invention relates to a solid-state imager and, more particularly, to a color filter array for use therewith.

Recent technical efforts in the art concerned are moving toward color imaging with a combination of a CCD, BBD, CPD, MOS or like solid-state imager and a stripe or mosaic color filter array. Color filter arrays are generally classified into two types, i.e., primary color type filter array employing red, green and blue (RGB), and complementary color type filter array employing white, yellow and cyan (WYC), or white, yellow, cyan and green (WYCG), or the like. In the WYCG or like part-primary, part-complementary color filter array, good color reproduction is unattainable unless the spectral characterristic of the primary color coincides with one which is to be set up when those of two complementary colors are superposed. Prior art color filter arrays, however, have failed to achieve the necessary spectral characteristic and, therefore, desired color reproduction.

Meanwhile, a recent improvement in the resolution of solid-state imagers is accompanied by a decrease in the size of picture elements or pixels. This in turn requires color filters to be furnished with color regions having accurate configurations. While a color solid-state imager needs a color filter array on a solid-state imager thereof, difficulty has been experienced in accurately forming a color filter array and uniformalizing the thickness of dye receiving resin layers due to significant roughness of the surface of the imager.

SUMMARY OF THE INVENTION

It is therefore an object of the present invention to provide a color filter array which is excellent in color reproduction.

It is another object of the present invention to provide a color solid-state imager using a color filter array which offers excellent color reproduction.

It is another object of the present invention to provide a generally improved color filter array for a color solid-state imager.

A color filter array of the present invention includes a uniform first layer made of a first dye receiving resin and a patterned second layer on the first layer made of a second dye receiving resin. The first color region is formed in the first layer and a second color region, overlapped with the first color region over at least one pixel, is formed by the second layer, or the first and second color regions are formed in the first layer and a third color region is formed by the second layer.

In accordance with the present invention, a first layer of first dye receiving resin is deposited to an even thickness on a substrate or on an imaging area of a solid-state imager. A first color region is patterned on the surface of the first layer and dyed in a first color.

A second layer is patterned on the first layer and the dyeing property of the second layer differs from that of the first dye receiving layer. A second color region, overlapping with the first color region over at least one pixel, is formed by the second layer, or the first and second color regions are formed in the first layer and a third color region is formed by the second layer between the first and second color regions in the first layer. The first dye receiving resin is hydrophobic and the second is hydrophilic. A light intercepting layer can be formed except for photosensitive area of pixel between the first and second layers.

The above and other objects, features and advantages of the present invention will become apparent from the following detailed description taken with the accompanying drawings.

BRIEF DESCRIPTION OF THE PREFERRED EMBODIMENTS

While the color filter array for a color solid-state imager of the present invention is susceptible of numerous physical embodiments, depending upon the environment and requirements of use, substantial numbers of the herein shown and described embodiments have been made, tested and used, and all have performed in an eminently satisfactory manner.

Figure 1:
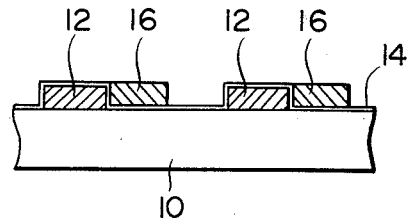
FIG. 1 is a view of a prior art color filter array.

Before entering into detailed discription of the present invention, a brief reference will be made to prior art color filter arrays illustrated in FIGS. 1-3. As shown in FIG. 1, a prior art color filter array comprises a substrate 10 which carries thereon a first color region 12 formed by casein, gelatin, glue or like hydrophilic resin to which photosensitivity is given by addition of dichromate. The first color region 12 is dyed in a first color by a hydrophilic dye such as an acid dye. An intermediate or dye-proofing layer 14 is made on the first color region 12 as well as on the substrate 10. Further, a second color region 16 is formed on the substrate 10 which is covered with the dye-proofing layer 14. The second color region 16 is dyed in a second color. Such a procedure is repeated to fabricate a color filter array.

A WYCG or like part-primary, part-complementary color filter array will attain favorable color reproduction only when the spectral characteristic of the primary color coincides with one which is to be given by superposing those of two complementary colors. This will be discussed taking the WYCG color filter array for example.

Figure 2:
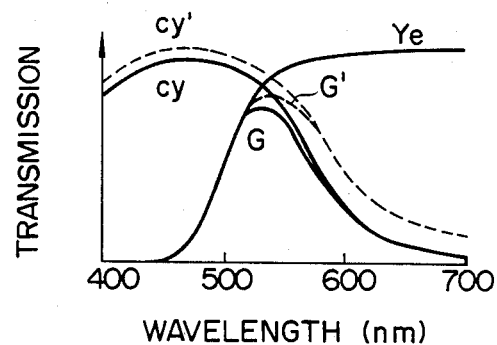
FIG. 2 is a graph representing a spectral characteristic of a part-primary, part-complementary color filter array.

The WYCG color filter array has to have G (green) coinciding with overlapping part of Cy (cyan) and Ye (yellow) with respect to spectral characteristic, as represented by curves Cy, Ye and G in FIG. 2. G, therefore, has to be formed not in a discrete color region but in superposed part of two different color regions, Cy and Ye.

Figure 3:
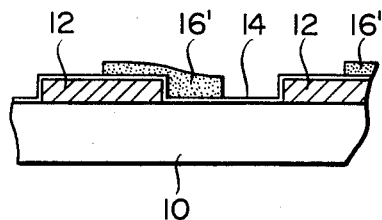
FIG. 3 is a view of a prior art color filter in which different color regions overlap each other.

To cause different color regions to overlap each other, a prior art color filter array is configured as illustrated in FIG. 3. Resin forming a second color region (e.g. Cy) 16' has a reduced thickness on the first color region 12 resulting in the difference of the spectral characteristic between Cy' on the first color region (Ye) 12 and Cy on the other region, as shown in FIG. 2. This entails a shift in the spectral characteristic of the overlapping part to G' which differs from the required one, G, thereby degrading the color reproduction. Meanwhile, in a color solid-state imager, a color filter array has to be formed on a solid-state imager. A rough imager surface, however, does not readily allow a color filter array such as shown in FIGS. 1 or 3 to be patterned with accuracy thereon or resin layers to be deposited to even thickness.

Hereinafter will be described in detail some preferred embodiments of the present invention which eliminate the drawbacks discussed above.

Figure 4:
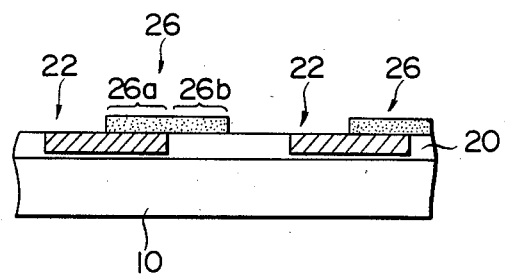
FIGS. 4 and 5 are views of a color filter array and a color solid-state imager in accordance with a first embodiment of the present invention.

Referring to FIG. 4, a color filter array embodying the present invention is shown. Polyester resin, acrylic resin, polyarylate resin, polycarbonate resin, aromatic polysulphone resin or like resin, which cannot be dyed by acid dyes, is deposited on a substrate 10 to an even thickness to form a first dye receiving layer 20. A first color region 22 of the first dye receiving layer 20 is dyed in a first color such as yellow (Ye) by disperse dye or cationic dye, using a mask. A second dye receiving layer 26 is made of casein, gelatin, glue, polyvinyl alcohol or like resin, which can be dyed by acid dyes, with dichromate added thereto for photosensitivity. A second dye receiving layer 26 is patterned for forming a second color region which overlaps with the first color region 22 over an area corresponding to at least one pixel.

As described above, the first dye receiving layer 20 in accordance with the illustrated embodiment extends with an even thickness even outside of the first color region 22, so that the second color region can be deposited to the same thickness both in an overlapping portion 26a on the first color region 22 and in the other portion 26b. Therefore, when dyed cyan (Cy) by the second dying, the second dye receiving layer 26 will attain the same spectral characteristic in the overlapping portion 26a and in the other portion 26b, thereby furnishing the color filter array with a good color reproduction characteristic. It will be noted that the structure shown in FIG. 4 eliminates the need for the dye-proofing layer 14 such as shown in FIG. 1 or 3, because the first dye receiving layer 20 is immune to the dye which dyes the second dye receiving layer 26.

Concerning a color filter array of the type which is formed on a light transmitting substrate, the first dye receiving layer 20 may be made of hydrophilic resin and the second dye receiving layer 26 may be a photoresist of hydrophobic resin. The gist is that use is made of dyes for the first dye receiving layer 20 which are immune to dyes adapted to dye the second receiving layer 26, that is, two dye receiving resins having different dyeing properties are used.

Figure 5:
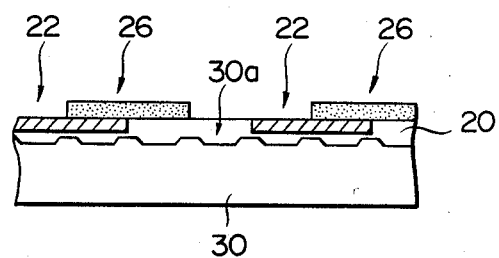

In the case of a color solid-state imager shown in FIG. 5, roughness on the surface 30a of a solid-state imager 30 ranging from about 1 to 2 μm can be eliminated by depositing the first dye receiving layer 20 thereon. This facilitates local patterning which is required for the second dye receiving layer 26. It is desirable for a color solid-state imager to employ hydrophobic resins which can be dyed by disperse dyes for its first dye receiving layer, and hydrophilic resins which can be dyed by acid dyes for its second dye receiving layer. This is because the imager is protected by the hydrophobic resin layer during dyeing with acid dye which contains alkali metal.

The embodiment described above will be better understood from the following description of practical examples.

EXAMPLE 1

A solution of polyethyleneterephthalate in hexafluoracetone was applied to a thickness of about 3 μm to a glass substrate. A mask was prepared using casein photoresist G-90S (Tokyo Ohka Kogyo Co., Ltd.) after which the layer on the glass substrate was dyed by disperse dye SUMIKARON YELLOW E-4GL (Sumitomo Chemical Co., Ltd.) in the manner shown in FIG. 4 thereby forming a first color region. This was followed by removing the mask, patterning a second color region by means of the above-mentioned casein photoresist, and then dyeing the second color region cyan with acid dye AMINYL SKYBLUE E-BL (Sumitomo Chemical Co., Ltd.). Spectral characteristics of the first color region (yellow), second color region (cyan) and overlapping portion were measured by a microspectrophotometer. The measurement showed that the spectral characteristic of green in the overlapping portion coincides with the combined spectral characteristic of yellow in the first color region and cyan in the second color region, proving the effect attainable with the embodiment shown and described.

EXAMPLE 2

Example 1 was repeated to form a color filter array on a CCD imager. The resulting color solid-state imager attained good color reproduction when used to pick up images. Because the roughness on the imager surface was eliminated by the first dye receiving resin, the second color region could be patterned with ease and accuracy.

It will be seen from the above description that the first embodiment of the present invention is successful to improve the color reproduction of a color filter array having overlapping color regions and, therefore, that of a color solid-state imager.

Figure 6:
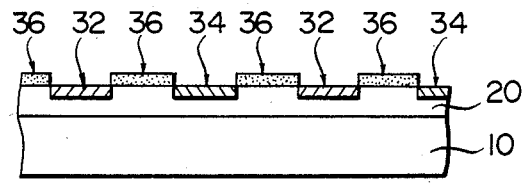
FIGS. 6 and 7 are views of a color filter array and a color solid-state imager in accordance with a second embodiment of the present invention.

Referring to FIG. 6, a second embodiment of the present invention is shown. Evenly deposited on the substrate 10 is the first dye receiving layer 20 made of resin which cannot be dyed by acid dyes. Such resin may be selected from the group consisting of polyester resin, polyarylate resin, acrylic resin, polycarbonate resin and aromatic polysulphone resin. In the first dye receiving layer 20, a first color region 32 is dyed blue, for example, and a second color region 34 is dyed red, for example, by disperse dyes, using dyeing masks. A second dye receiving layer 36, made of casein, gelatin, glue, polyvinyl alcohol or like dye receiving resin, which can be dyed by acid dyes, with dichromate added thereto for photosensitivity, is patterned on the first dye receiving layer 20 and then dyed, for example, green.

As described above, the third color region 36 patterned on the flat first dye receiving layer 20 in accordance with the second embodiment is provided with a uniform thickness distribution, which will set up a constant signal level throughout a horizontal scan line. Again the use of dye receiving resins of different dyeing properties makes it needless to employ the intermediate dye-proofing layer such as shown in FIGS. 1 or 3, while the first dye receiving resin may comprise hydrophilic resin and the second dye receiving resin may comprise a photoresist of hydrophobic resin.

Figure 7:
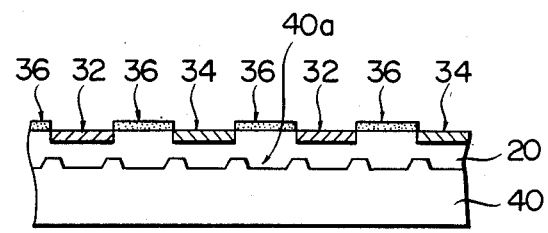

In the case of a color solid-state imager, as shown in FIG. 7, roughness on the order of 1 to 2 μm on the surface 40a of a solid-state imager 40 is leveled by the first dye receiving layer 20, facilitating patterning of the third color region 36, made by the second dye receiving resin which requires local deposition. As in the embodiment shown in FIG. 5, a color solid-state imager should preferably comprise the combination of a first dye receiving resin which is hydrophobic and can be dyed by disperse dyes, and a second dye receiving resin which is hydrophilic and can be dyed by acid dyes.

The second embodiment will be described in more detail in conjunction with some examples thereof.

EXAMPLE 3

A solution of polyethersulphone (PES) resin 100P COATING GRADE (Sumitomo Chemical Co., Ltd.) in N-methyl-2-pyrrolidone was applied to a glass substrate to a uniform thickness of about 4 μm, forming a first dye receiving layer 20 as shown in FIG. 6. Masked by casein photoresist G-90S (Tokyo Ohka Kogyo Co., Ltd.), the first dye receiving layer 20 was dyed blue in a first color region 32 and red in a second color region 34 by disperse dyes (Sumitomo Chemical Co., Ltd.). Thereafter, a third color region 36 was patterned by the casein resist and then dyed green by acid dye (Sumitomo Chemical Co., Ltd.). When the resulting color filter array was used to pick up an image bonded to a CCD solid-state imager, no difference developed in signal level throughout a horizontal scan line and the array offered images with good color reproduction because of the uniform spectral characteristic due to the uniform thickness of the second layer.

EXAMPLE 4

Example 3 was repeated to fabricate a color filter array on a CCD solid-state imager. The color solid-state imager was found comparable to the imager of Example 3 regarding the constant signal level in a horizontal scan line and, therefore, in the excellence of color reproduction.

The present invention is also applicable to a color solid-state imager of the type having a light intercepting layer on a uniform layer of dye receiving resin. An example of such an application will be described.

EXAMPLE 5

Figure 8:
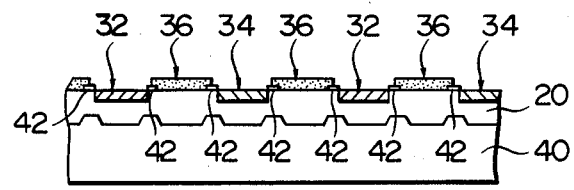
FIG. 8 is a view of a color solid-state imager in accordance with a third embodiment of the present invention.

As shown in FIG. 8, a uniform layer 20 of dye receiving resin was deposited on a CCD solid-state imager 40, after which an aluminum light intercepting layer 42 was patterned except for the photosensitive area of pixel. This was followed by the procedure of Example 4 to fabricate a color filter array. Because the third color region 36 covered the major part of the aluminum layer 42, flare due to reflection at the surface of the imager was suppressed to further improve the spectral characteristic and thereby the color reproduction of the color filter array. In this configuration, the dyed pattern in the first layer and the filter area in the second layer is accurately defined by aluminum window. Then, the color filter array can be made accurately with ease.

It will be understood from Examples 3-5 that the second embodiment of the present invention provides a color filter array and, therefore, a color solid-state imager which attains excellent color reproduction due to no fluctuation allowed in signal level for each horizontal scan because of the uniform spectral characteristic.

While the second embodiment has been shown and described as employing blue for the first color, red for the second, and green for the third, any other combination of colors is applicable such as one of green for the first, red for the second, and blue for the third.

Various modifications will become possible for those skilled in the art after receiving the teachings of the present disclosure without departing from the scope thereof.

What is claimed is:

1. A color filter array comprising:
   a uniform first layer made of first dye receiving resin and having a first color region which is dyed in a first color; and
   a second layer made of second dye receiving resin, a dyeing property of which differs from a dyeing property of said first dye receiving resin, said second layer partly overlaying the first layer and having a second color region which is dyed in a second color throughout the second layer;
   said second color region partly overlapping the first color region.

2. A color filter array as claimed in claim 1, further comprising a substrate on which the first layer is deposited.

3. A color filter array as claimed in claim 1, in which the first dye receiving resin is hydrophilic and the second dye receiving resin is hydrophobic.

4. A color filter array as claimed in claim 1, further comprising a solid-state imager, the first layer being deposited on an imaging area of said imager.

5. A color filter array as claimed in claim 4, in which the first dye receiving resin is hydrophobic and the second dye receiving resin is hydrophilic.

6. A color filter array comprising:
   a uniform first layer made of first dye receiving resin and having a first color region which is dyed in a first color and a second color region which is dyed in a second color; and
   a second layer made of second dye receiving resin, a dyeing property of which differs from a dyeing property of said first dye receiving resin, said second layer partly overlapping the first layer and having a third color region which is dyed in a third color throughout the second layer;
   said second layer and said third color region overlaying the first layer between the first and second color regions.

7. A color filter array as claimed in claim 6, further comprising a substrate on which the first layer is deposited.

8. A color filter array as claimed in claim 6, in which the first dye receiving resin is hydrophilic and the second dye receiving resin is hydrophobic.

9. A color filter array as claimed in claim 6, further comprising a solid-state imager, the first layer being deposited on an imaging region of said imager.

10. A color filter array as claimed in claim 9, in which the first dye receiving resin is hydrophobic and the second dye receiving resin is hydrophilic.

11. A color filter as claimed in claim 9, further comprising a partial light intercepting layer deposited between the first and second layers.

12. A color filter as claimed in claim 11, in which the partial light intercepting layer is made of aluminum.

UNITED STATES PATENT AND TRADEMARK OFFICE
CERTIFICATE OF CORRECTION

PATENT NO. : 4,580,159

DATED : April 1, 1986

INVENTOR(S) : Daisuke Manabe

It is certified that error appears in the above-identified patent and that said Letters Patent is hereby corrected as shown below:

Column 1, line 22, change "characterristic" to --characteristic--;
         line 68, delete "and a" and insert after "layer" --.--.
Column 2, line 1, before "third" insert --A-- and delete "by the second layer";
         line 2, delete "in the first" and insert --by the second layer--;
         line 3, delete "layer".

Signed and Sealed this

Tenth Day of February, 1987

*Attest:*

DONALD J. QUIGG

*Attesting Officer*      *Commissioner of Patents and Trademarks*